(12) United States Patent
Sanfilippo et al.

(10) Patent No.: US 9,915,708 B2
(45) Date of Patent: Mar. 13, 2018

(54) METHOD FOR MANUFACTURING A HALL SENSOR ASSEMBLY AND A HALL SENSOR ASSEMBLY

(71) Applicant: PAUL SCHERRER INSTITUT, Villigen PSI (CH)

(72) Inventors: Stephane Sanfilippo, Goldau (CH); Vjeran Vrankovic, Wuerenlingen (CH); Christina Wouters, Wuerenlingen (CH)

(73) Assignee: Paul Scherrer Institut, Villigen PSI (CH)

( * ) Notice: Subject to any disclaimer, the term of this patent is extended or adjusted under 35 U.S.C. 154(b) by 335 days.

(21) Appl. No.: 14/763,296

(22) PCT Filed: Dec. 6, 2013

(86) PCT No.: PCT/EP2013/075827
§ 371 (c)(1),
(2) Date: Jul. 24, 2015

(87) PCT Pub. No.: WO2014/114401
PCT Pub. Date: Jul. 31, 2014

(65) Prior Publication Data
US 2015/0362565 A1 Dec. 17, 2015

(30) Foreign Application Priority Data
Jan. 24, 2013 (EP) .................................... 13152555

(51) Int. Cl.
*G01R 33/07* (2006.01)
*G01D 5/14* (2006.01)
(Continued)

(52) U.S. Cl.
CPC ............. *G01R 33/07* (2013.01); *G01D 5/145* (2013.01); *G01R 33/0005* (2013.01);
(Continued)

(58) Field of Classification Search
CPC .......................... G01R 33/07; G01R 33/0206; G01R 33/0005; H01L 43/14; H01L 43/10; H01L 43/04
(Continued)

(56) References Cited

U.S. PATENT DOCUMENTS 4,656,750 A * 4/1987 Pitt ........................ G01C 17/26
324/247
2010/0097059 A1 * 4/2010 Estrada .............. G01R 33/0005
324/251
(Continued)

FOREIGN PATENT DOCUMENTS

EP 2261648 A1 12/2010
EP 2261684 A1 12/2010
(Continued)

*Primary Examiner* — Melissa Koval
*Assistant Examiner* — Trung Nguyen
(74) *Attorney, Agent, or Firm* — Laurence Greenberg; Werner Stemer; Ralph Locher

(57) ABSTRACT

An assembly of Hall sensors provides the following: the three averaged values for the magnetic field components are assigned to the same point in space, at the center of the Hall sensor assembly. This allows for the instantaneous measurement of the full field vector. With the appropriate electrical connections of the Hall elements from opposing surfaces of each pair, undesired planar Hall effect is practically cancelled out.

14 Claims, 4 Drawing Sheets

(51) Int. Cl.
  *G01R 33/00*    (2006.01)
  *G01R 33/02*    (2006.01)
  *H01L 43/04*    (2006.01)
  *H01L 43/06*    (2006.01)
  *H01L 43/10*    (2006.01)
  *H01L 43/14*    (2006.01)

(52) U.S. Cl.
  CPC ..... *G01R 33/0052* (2013.01); *G01R 33/0206* (2013.01); *H01L 43/04* (2013.01); *H01L 43/065* (2013.01); *H01L 43/10* (2013.01); *H01L 43/14* (2013.01)

(58) Field of Classification Search
  USPC ....... 324/251, 117, 127, 252, 253, 500, 600, 324/207.13–207.2, 242–247, 529–530, 324/117 H
  See application file for complete search history.

(56) References Cited

U.S. PATENT DOCUMENTS

| | | |
|---|---|---|
| 2011/0014633 A1 | 1/2011 | Ifuku et al. |
| 2012/0146164 A1 | 6/2012 | Ausserlechner |
| 2015/0102807 A1* | 4/2015 | Eckinger .............. G01R 33/072 324/251 |

FOREIGN PATENT DOCUMENTS

| | | |
|---|---|---|
| EP | 2551691 A1 | 1/2013 |
| GB | 2159278 A | 11/1985 |
| WO | 9523342 A1 | 8/1995 |

* cited by examiner

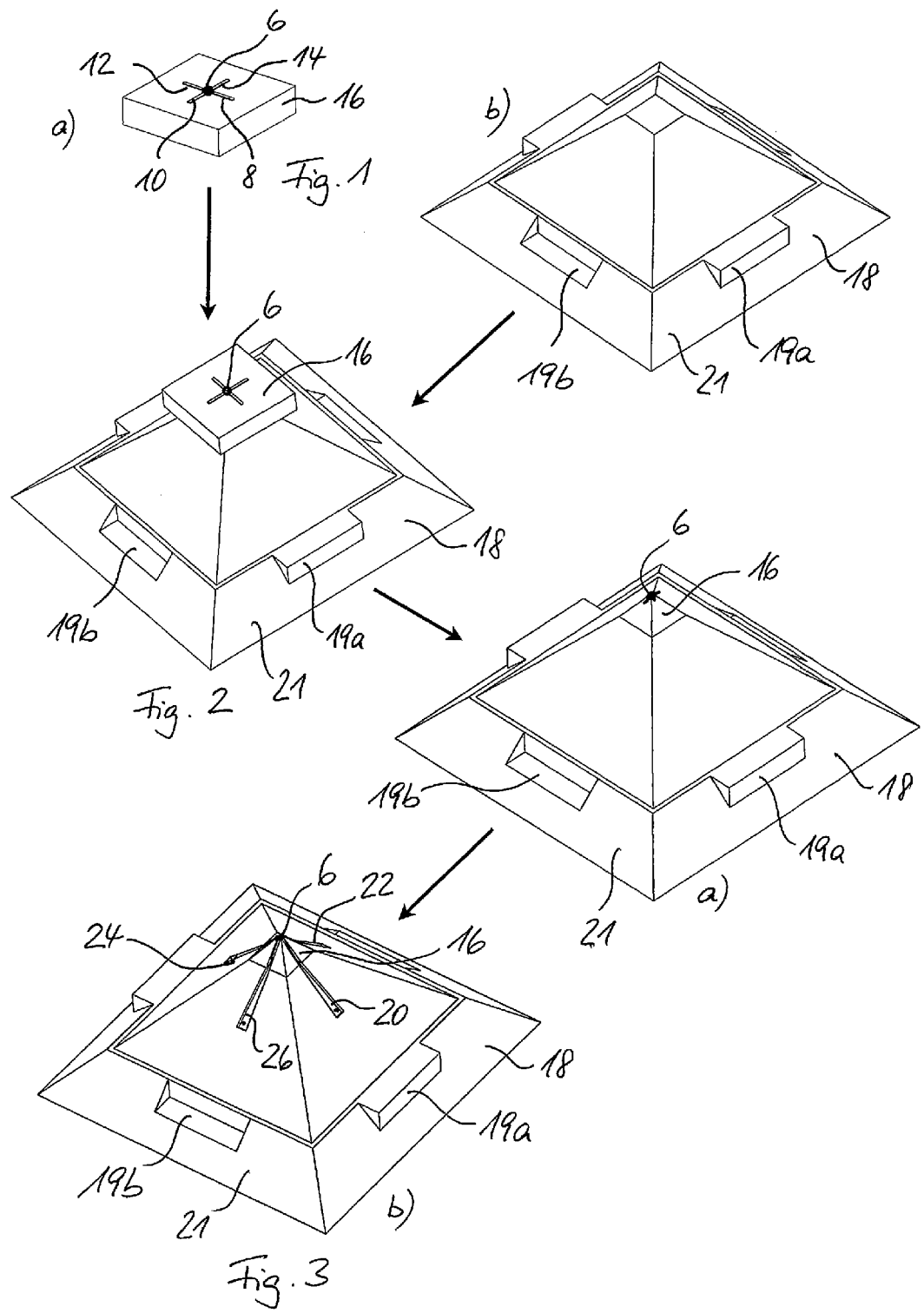

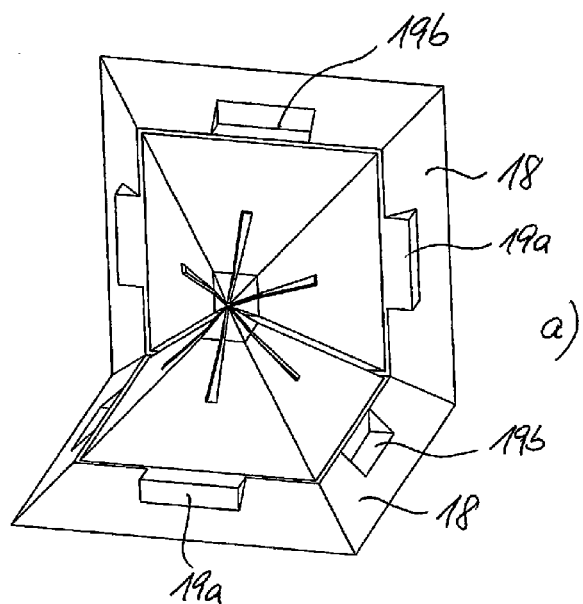
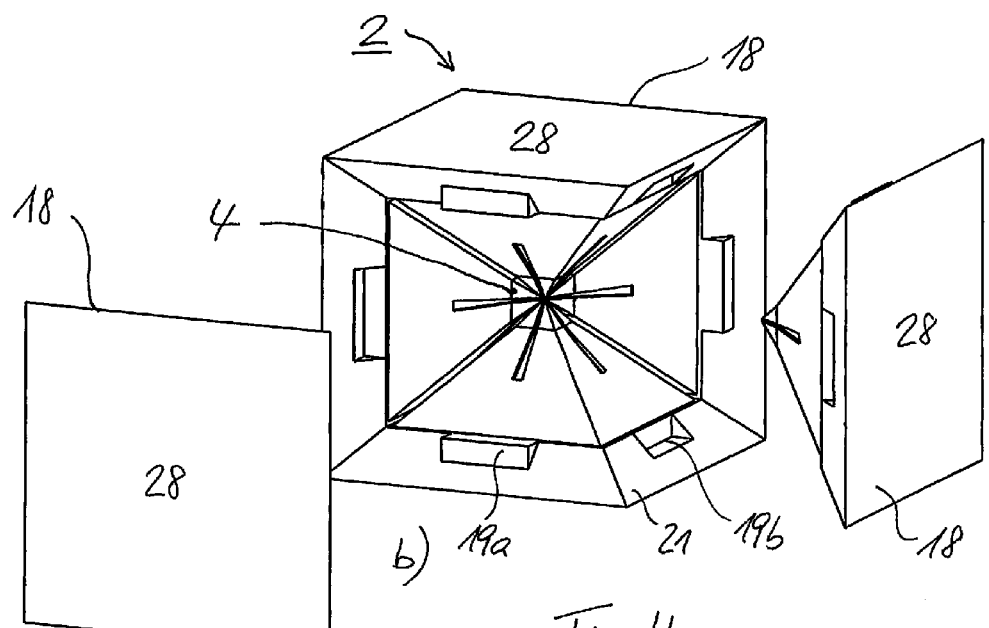
Fig. 4

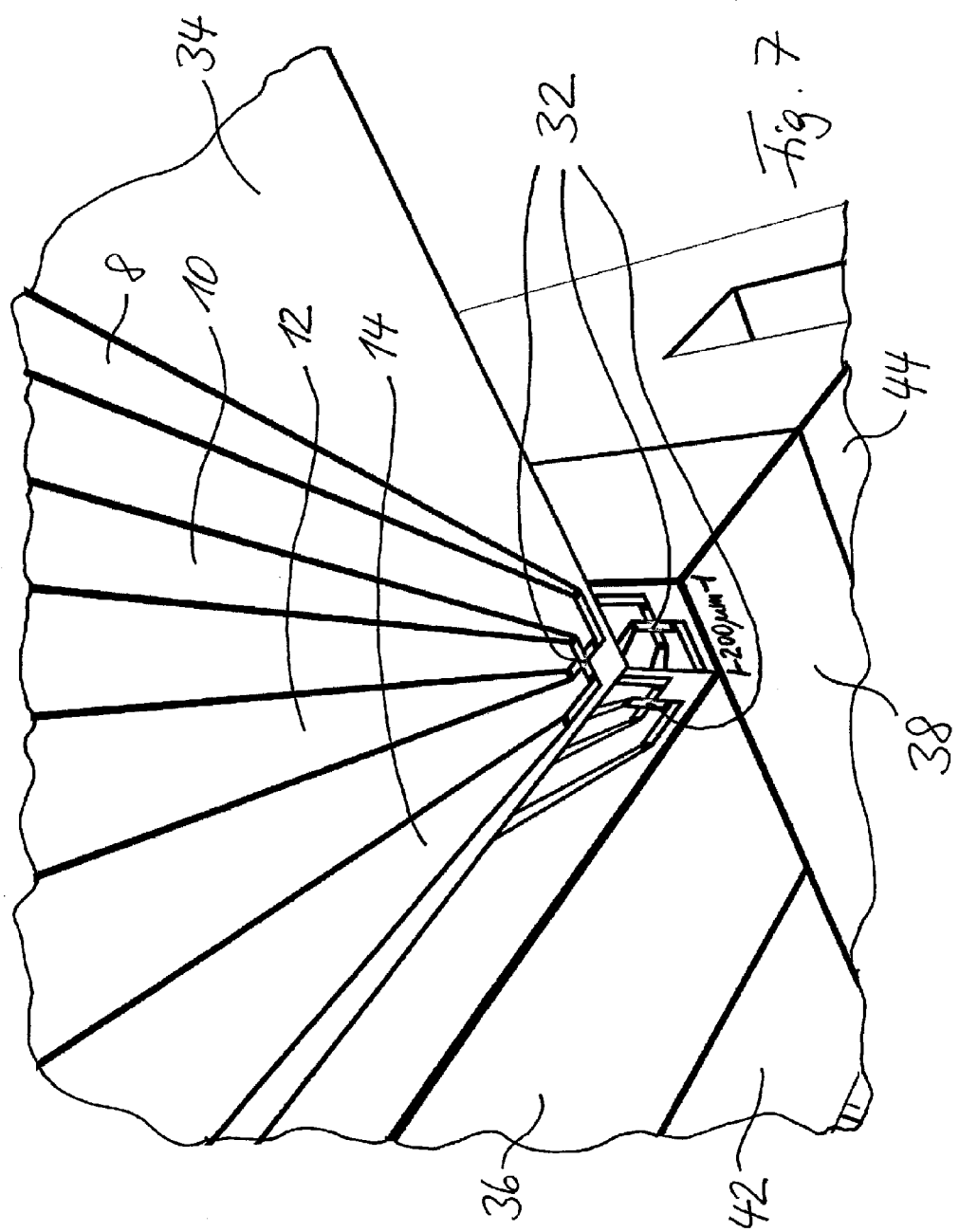

METHOD FOR MANUFACTURING A HALL SENSOR ASSEMBLY AND A HALL SENSOR ASSEMBLY

BACKGROUND OF THE INVENTION

Field of the Invention

The present invention relates to a method for manufacturing a Hall sensor assembly and a Hall sensor assembly. Hall sensors are known as sensors to measure the strength of a magnetic field by measuring a voltage. Different from inductive measurements, a Hall sensor can also sense DC magnetic fields since the voltage output of a Hall sensor under current is proportional to the current and the strength of the magnetic field. Three-Dimensional Magnetic Field Sensors are disclosed in the British Patent Application GB 2 159 278 A. Hall sensors are used in a broad variety of scientific and commercial applications, such as in position sensing, in proton therapy, in NMR, in synchrotron and other particle accelerators or electromagnetic beam lines and magnets and so on.

BRIEF SUMMARY OF THE INVENTION

It is well known in the art to measure the strength of the magnetic field using Hall sensors. Nevertheless, it is still a challenge to measure all three components of a magnetic field vector to an accuracy better than 1%. It is therefore the goal of the present invention to improve the known state of the art, in particular the readiness to measure a magnetic field in a single point in space and time.

With respect to the Hall sensor assembly, this goal is achieved according to the present invention by a Hall sensor assembly, comprising a number of Hall sensors, each Hall sensor being disposed on a non-conducting, non-magnetic support part, wherein the support parts are formed to support the formation of three groups of Hall sensors, each group covering the measurement of the magnetic field for one of the three Cartesian directions wherein the three groups of Hall sensors, and in particular their Hall sensor active areas, are disposed adjacent to each other in order to share a common Hall sensor active volume that is smaller than or equal to 200 µm×200 µm×200 µm.

With respect to the method for manufacturing a Hall sensor assembly, this goal is achieved according to the present invention by the following method steps:
a) depositing a Hall sensor active area on a substrate;
b) contacting the Hall sensor active area with four contact lines being hosted on the sensor substrate;
c) mounting the sensor substrate to a support part;
d) optionally removal of excess material from the sensor substrate and the support part;
e) extending the four contact line along the support part;
f) assembling a number of support parts manufactured according to the step a) to e) in order to form three groups of Hall sensors, each group covering the measurement of the magnetic field for one of the three Cartesian directions wherein the three groups of Hall sensors are disposed adjacent to each other in order to share a common Hall sensor active volume that is smaller or equal to 200 µm×200 µm×200 µm.

Therefore, the present invention provides for a Hall sensor assembly as a miniature Hall effect 3D magnetic field sensor because the Hall sensor active areas are all concentrated in the miniature Hall sensor active volume wherein each of the three groups of sensors is dedicated to determine one component of the magnetic field vector. Due to the small design of Hall sensor active areas in the range of micrometers (i.e. less than 50 µm), each group which can comprise one or more Hall sensor active areas is disposed in a tiny volume of less than or equal to 200 µm×200 µm×200 µm. This effectively means that all Hall sensor active areas yield, through averaging, the full magnetic field vector in a single point in space and time. The miniaturization of the Hall sensor active volume that is achieved with the present invention plays the key role in the improvement of the accuracy of 3D Hall sensors. The miniature spacing between adjacent Hall sensor active areas reduces significantly errors stemming from averaging the sensors output values in measurements of magnetic fields with a non-linear distribution, like in sextupoles and higher multipole magnets or fringe fields.

In a preferred embodiment of the present invention, the support parts are formed as truncated pyramids wherein each Hall sensor is disposed on the peak of a pyramidal support part. This design allow to concentrate diverse Hall sensor active areas directly adjacent to each other wherein the support part may have a design to offer a reference surface when positioning the Hall sensor assembly for rotating the Hall sensor assembly during calibration as well as for the positioning when measuring. Preferably, the pyramidal support parts represent a cube when assembled. Said pyramidal support then comprise a square ground area and angle of 45° and 90° in the peak of the pyramid.

In order to provide an accuracy in the range of better than $10^{-3}$ the Hall sensor active area as well as the sensor substrate can be made from a semiconductor material, preferably GaAs, and the four contact lines are made from a highly conducting material, preferably from gold.

In order to support the accuracy of the measurements, it is important that the surrounding materials do not distort the magnetic field to be measured. Therefore, a preferred choice may provide for support parts that are made from a non-conducting and non-magnetic material, preferably from crystal (i.e. sapphire) or a ceramics or from a composite material.

During manufacturing, after the assembly of the Hall sensor active area and the sensor substrate on the support part, the removal of excess substrate material can be preferably performed by an abrasive method, such as laser cutting, laser grinding or the like.

In order to provide for a preferred solution for the contacting of the contact lines of the Hall sensor active area, it is advantageous when the surfaces of the support parts are at least partially coated with a conductive layer; said conductive layer being separated into four sections; each section being connected to one of the four contact lines. Preferably, the support parts are at least partially coated with gold. Of course, the conductive layer is coated with an insulating layer prior to the assembling of the support parts in order to separate the contact lines from one Hall sensor to the other. This insulating layer may be rendered obsolete by spacing the support parts when assembling. The isolation among the different conductive layer is then achieved either just by the air gap or an additional insulation material filling the gaps.

For the accuracy of the Hall sensor assembly, the calibration has to be performed properly. In order to enable for a sufficient calibration, it is advantageous when at least one of the support parts comprises a reference surface enabling the positioning of the Hall sensor assembly for a rotation during calibration of the Hall sensor assembly.

As already mentioned earlier, a preferred design of the Hall sensor assembly provides for the support parts to be formed as truncated pyramids wherein the Hall sensor active areas are disposed with its sensor substrate on the upper surface of the truncated pyramids. Preferably, six pyramids having a square ground area are assembled to form a cube wherein the Hall sensor active areas are all located in the spatial center of the cube.

A further preferred embodiment of the present invention can be realized when the support parts are formed as cuboids and the Hall sensors are comprised on a substrate; said substrate being mounted to one surface of the cuboidic support part wherein the Hall sensor active area is located at one corner of the substrate. The complete Hall sensor assembly then comprises for example six cuboidic support parts together with the substrates mounted to one surface of the cuboidic support parts which in the assembled form represent in general a cube when assembled with in the center a miniature common Hall sensor active volume. A tiny inner cube volume (of less than or equal to 200 µm×200 µm×200 µm) comprising the active areas of orthogonally oriented Hall sensors is realized by designing the Hall sensor active area to be at the corner of each of the substrates and by the special assembly of the cuboidic support parts together with the Hall sensors mounted to one surface of each of the cuboidic support parts.

Advantages of the design using cuboidic support parts with respect to the design using pyramidal support parts, while achieving the same goal, are: easier support fabrication, more accurate assembly, easier contacting (which can be achieved on chip), more flexibility for internal sensor connections, as well as a possible fabrication cost reduction if laser cutting step can be avoided.

BRIEF DESCRIPTION OF THE SEVERAL VIEWS OF THE DRAWING

Preferred examples of the present invention are hereinafter explained in more detail with references to the attached drawings which depict in:

FIG. 1 a Hall sensor comprising a Hall sensor active area and a substrate;

FIG. 2 the Hall sensor mounted onto a truncated support pyramid;

FIG. 3 the Hall sensor on the truncated support pyramid with Ohmic contacts;

FIG. 4 the assembly of six pyramids to form a miniature internal cube, said internal cube being the central Hall sensor active volume, comprised of six Hall sensor active areas, two for each component of the magnetic field vector;

FIG. 7 an enlarged view on the Hall sensor active volume in FIG. 5.

DESCRIPTION OF THE INVENTION

Figure 5:
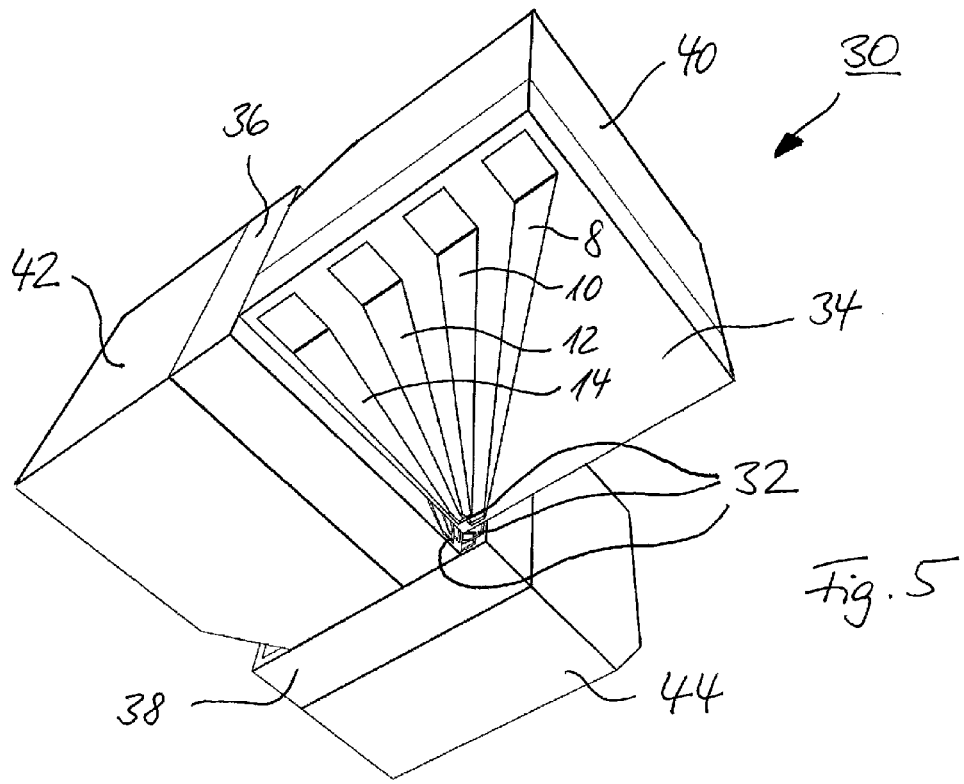
FIG. 5 the assembly of three cuboidic support parts with an alignment of three Hall sensors in a central Hall sensor active volume.

In FIG. 4 one preferred example of the present invention is presented: a design of a Hall sensor assembly cube 2 of a few mm in size, made in such a way to form in the spatial centre 4 of the cube an inner cube of sub-millimeter dimension with a Hall sensor active area on each of its surfaces. As shown in FIG. 1, a semiconductor Hall sensor active area 6 has four electrical connections 8 to 14, two connections for the driving current (AC or DC) and two connections for the output voltage signal. The Hall sensor active area 6 and the electrical connections 8 to 14 build a Hall element disposed on a semiconductor sensor substrate 16. In the present example, the Hall sensor active area 6 is epitaxially grown on the sensor substrate 16.

The semiconductor sensor substrate 16 is in the present example mounted to a truncated pyramid support part 18 made from a crystal or a ceramic or a composite material, as presented in FIG. 2.

In FIG. 3, the situation is shown after the removal of excess material from the sensor. The contact lines 8 to 14 are each connected with conductive layers 20 to 26 deposited on parts of the surfaces of the pyramid support part 18. Of course, the conductive layers 20 to 26 may be coated with an insulator layer in order to separate each contact line 8 to 14 and its respective conductive layer 20 to 26 from those of another support pyramid. In the present example, the supports parts 18 are being spaced relatively to each other when assembled by connection elements 19a, 19b that are formed in the lower part 21 of the truncated pyramid support part 18. Due to the relative spacing, an insulation of the conductive layers 20 to 26 is resulting by air gap. Alternatively, an insulation material can be filled into the air gap.

The point illustrated in each conductive layer 20 to 26 shall represent the connection to a control electronics (not shown) which usually resides apart from the truncated pyramid support part 18.

As shown in FIG. 4, the geometry of the cube 2 is presently obtained by a precise assembly of six truncated pyramids 18. The miniature size and the geometrical precision of the epitaxially grown semiconductor Hall sensors active areas 6 are superior to the classical approach of gluing commercially available Hall sensors. The large benefit is the possibility of achieving a small distance (<200 µm) between two opposite (perpendicular) Hall sensor active areas 6 within the Hall sensor active volume thus considerably reducing the errors stemming from averaging the measured values from two perpendicular Hall sensors in magnetic fields with a nonlinear distribution, like in sextupoles and higher multipole magnets or in fringe fields. Each of the three pairs of Hall elements from opposite internal cube surfaces is dedicated to determine one component of the magnetic field vector. In the present example, the Hall sensor active volume 4 in the center of the cube 2 with six Hall sensors has a size of less than 200 µm×200 µm×200 µm. The flat square ground area 28 of each pyramid 18 serves as a reference surface in order to precisely position the Hall sensor assembly cube 2 during measurements and during calibration of the Hall sensor assembly cube 2.

Alternatively to the pyramidal support parts 18, the Hall sensor assembly may comprise a holder member, such as a glass cube, that comprises a number of bore holes, such as conical bore holes each tapering versus the center of the holder member. The support parts themselves will also have a conical shape accordingly with the Hall sensor active area and the Hall sensor substrate being located at the tip of the conical support part.

Figure 6:
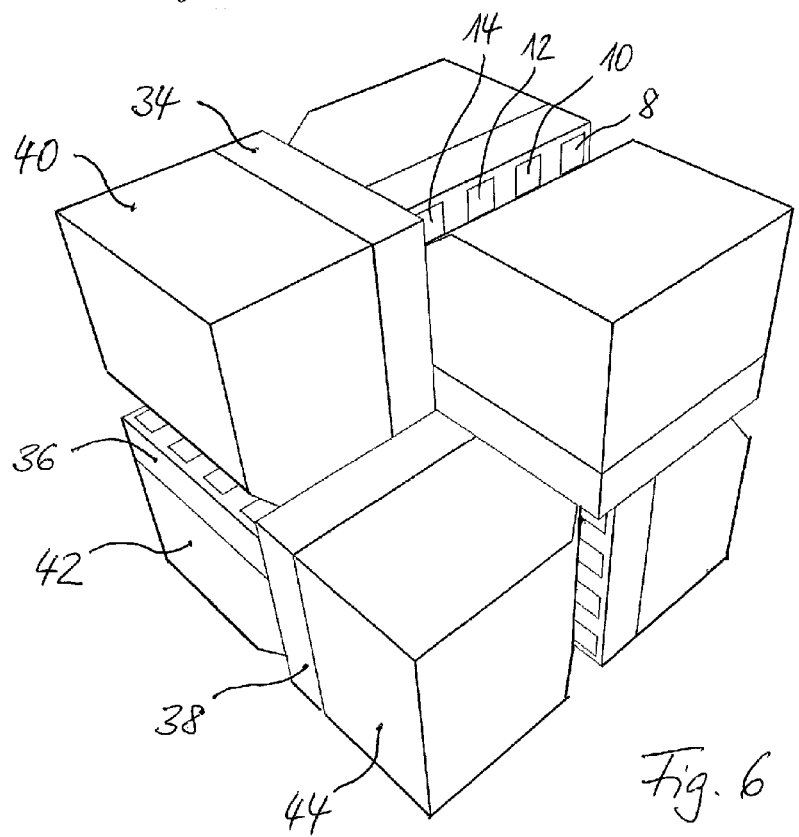
FIG. 6 the assembly of FIG. 5 comprising three pairs of Hall sensors being disposed on six cuboidic support parts.

Another preferred embodiment of the present invention is shown in FIG. 5, 6, 7. FIG. 5 shows one half of a substantially cubic structure (FIG. 6) comprising three Hall sensors 34, 36, 38 which are each mounted on an individual support 40, 42, 44. Each Hall sensor active area 32 is contacted by four contact lines 8 to 14. The support parts 40, 42, 44 are formed as cuboids and the Hall sensor active areas 32 are comprised on the substrates 34, 36, 38; said substrates 34, 36, 38 are each mounted to one surface of the cuboidic support parts 40, 42, 44 wherein the Hall sensor active areas 32 are located at one corner of the substrate 34, 36 and 38. When assembled, the three Hall sensor active areas 32 are disposed centrally within a Hall sensor active volume of less than or equal to 200 µm×200 µm×200 µm.

FIG. 6 shows an assembly of FIG. 5 and its mirror image which leads to a substantially cubic with a miniature internal cube; said internal cube being the central Hall sensor active volume, comprised of six Hall sensor active areas, two for each component of the magnetic field vector. A tiny inner cube volume (of less than or equal to 200 µm×200 µm×200 µm) comprising the active areas of orthogonally oriented Hall sensors is realized by designing the Hall sensor active area to be at the corner of each of the substrates and by the special assembly of the cuboidic support parts with a Hall sensor mounted to one surface of it. FIG. 7 illustrates the alignment of the Hall sensor active areas for three Hall sensors 32 (one half of the substantially cubic).

The advantages of the current invention with respect to existing three-axis Hall sensors are:
the use of highly accurate single-axis Hall sensors;
double readings for each field component resulting in an improved accuracy;
the miniaturization of the Hall sensor active volume, resulting in an improved accuracy;
the averaged values of all three field components are assigned to the same point in space, at the center of the Hall sensor assembly, thus allowing for instantaneous measurements of the full field vector;
with the appropriate electrical connections of the Hall sensor active areas from opposing surfaces of each pair, the undesired planar Hall effect can be practically cancelled out.

Therefore, the present invention provides for a Hall sensor assembly as a miniature Hall effect 3D magnetic field sensor because the Hall sensor active areas are all concentrated in the Hall sensor active volume wherein each of the three groups of Hall sensors is dedicated to determine one component of the magnetic field vector. Due to the small design of Hall sensor active areas in the range of micrometers (i.e. less than 50 µm), each group which can comprise one or more Hall sensor active areas is disposed in a tiny volume of less than or equal to 200 µm×200 µm×200 µm. This effectively means that all Hall sensor active areas yield, through averaging, the full magnetic field vector in a single point in space and time. The miniaturization of the Hall sensor active volume that is achieved with the present invention plays the key role in the improvement of the accuracy of 3D Hall sensors. The miniature spacing between adjacent Hall sensor active areas reduces significantly errors stemming from averaging the sensors output values in measurements of magnetic fields with a non-linear distribution, like in sextupoles and higher multipole magnets or fringe fields.

The invention claimed is:

1. A Hall sensor assembly, comprising:
a plurality of non-conductive, nonmagnetic support parts;
a plurality of Hall sensors, each disposed on a respective said nonmagnetic support part;
said support parts having a shape of truncated pyramids with a square base area and being formed to support a formation of three groups of saki Hall sensors, each group covering a measurement of a magnetic field for one of three Cartesian directions;
said Hall sensors having active areas disposed with a sensor substrate on an upper surface of said truncated pyramids, and six said pyramids are assembled to form a cube with the Hall sensor active areas all located in a spatial center of the cube; and
said three groups of Hall sensors being disposed adjacent one another for sharing a common Hall sensor active volume that is smaller than or equal to 200 µm×200 µm×200 µm.

2. The Hall sensor assembly according to claim 1, wherein one respective pair of said Hall sensors is provided for each of the three Cartesian directions, and said two Hall sensors of each said pair are disposed each on an individual support part.

3. The Hall sensor assembly according to claim 1, wherein each said Hall sensor is disposed on a peak of a pyramidal support part.

4. The Hall sensor assembly according to claim 1 wherein said support parts are cuboid support parts and said Hall sensors are disposed on a substrate; said substrate being mounted to one surface of said cuboidic support part, wherein said Hall sensor is located at one outer corner of said substrate.

5. The Hall sensor assembly according to claim 4 wherein said cuboid support parts together with said substrates mounted to one surface thereof represent in general a cube when assembled, wherein all outer corners form said common Hall sensor active volume.

6. A method for manufacturing a Hall sensor assembly, comprising the steps of:
a) depositing a Hall sensor active area on a substrate;
b) contacting the Hall sensor active area with four contact lines on the sensor substrate;
c) mounting the sensor substrate to a support part, the support part being a truncated pyramid and the Hall sensor active area is disposed with its sensor substrate on an upper surface of the truncated pyramid;
d) optionally smoothing a passage from the sensor substrate and the support part;
e) extending the four contact lines along the support part;
f) assembling six pyramids manufactured according to steps a) through e) having a square base area to form a cube with the Hall sensor active areas all located in a spatial center of the cube in order to form three groups of Hall sensors, each group covering a measurement of a magnetic field for one of three Cartesian directions, wherein the three groups of Hall sensors are disposed adjacent one another in order to share a common Hall sensor active volume that is smaller than or equal to 200 µm×200 µm×200 µm.

7. The method according to claim 6, which comprises forming the Hall sensor active area and the sensor substrate from a semiconductor material, preferably GaAs, and forming the four contact lines from a high conducting material.

8. The method according to claim 7, wherein the semiconductor material is GaAs and the high conducting material is gold.

9. The method according to claim 6, wherein the support parts are made from a non-conducting and non-magnetic material.

10. The method according to claim 9, wherein the support parts are made from crystal or ceramics or from a composite material.

11. The method according to claim 6, which comprises coating the surfaces of the support parts at least partially with a conductive layer; the conductive layer being separated into four sections; each section being connected to one of the four contact lines.

12. The method according to claim 6, which comprises forming at least one of the support parts with a reference surface, enabling a positioning for a rotation during calibration of the Hall sensor assembly.

13. A method for manufacturing a Hall sensor assembly, comprising the steps of:
   a) depositing a Hall sensor active area on a substrate;
   b) contacting the Hall sensor active area with four contact lines on the sensor substrate;
   c) mounting the sensor substrate to a support part;
   d) optionally smoothing a passage from the sensor substrate and the support part;
   e) extending the four contact lines along the support part;
   f) assembling a plurality of support parts manufactured according to steps a) through e) in order to form three groups of Hall sensors, each group covering a measurement of a magnetic field for one of three Cartesian directions, wherein the three groups of Hall sensors are disposed adjacent one another in order to share a common Hall sensor active volume that is smaller than or equal to 200 μm×200 μm×200 μm; and
   thereby forming the support parts as cuboids and placing the Hall sensors on a substrate, mounting the substrate to one surface of the cuboid support part wherein the Hall sensor is located at one outer corner of a circuit chip.

14. The method according to claim 13 wherein the cuboid support parts together with the substrates mounted to one surface of the cuboid support parts represent in general a cube when assembled wherein all outer corners form the common Hall sensor active volume.

* * * * *